(12) United States Patent
Wakioka et al.

(10) Patent No.: US 9,748,195 B2
(45) Date of Patent: Aug. 29, 2017

(54) ADHESIVE FOR MOUNTING FLIP CHIP FOR USE IN A METHOD FOR PRODUCING A SEMICONDUCTOR DEVICE

(71) Applicant: SEKISUI CHEMICAL CO., LTD., Osaka (JP)

(72) Inventors: Sayaka Wakioka, Osaka (JP); Hiroaki Nakagawa, Osaka (JP); Yoshio Nishimura, Osaka (JP); Shujiro Sadanaga, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/933,145

(22) Filed: Nov. 5, 2015

(65) Prior Publication Data

US 2016/0056120 A1 Feb. 25, 2016

Related U.S. Application Data

(62) Division of application No. 14/391,781, filed as application No. PCT/JP2013/071167 on Aug. 5, 2013, now Pat. No. 9,209,155.

(30) Foreign Application Priority Data

Aug. 6, 2012 (JP) .................................. 2012-174222

(51) Int. Cl.
| | |
|---|---|
| H01L 23/48 | (2006.01) |
| H01L 21/00 | (2006.01) |
| H01L 23/00 | (2006.01) |
| H01L 21/768 | (2006.01) |
| C09J 163/00 | (2006.01) |
| C08K 9/06 | (2006.01) |
| H01L 21/56 | (2006.01) |

(52) U.S. Cl.
CPC ................ *H01L 24/29* (2013.01); *C08K 9/06* (2013.01); *C09J 163/00* (2013.01); *H01L 21/563* (2013.01); *H01L 21/76841* (2013.01); *H01L 24/27* (2013.01); *H01L 24/73* (2013.01); *H01L 24/81* (2013.01); *H01L 24/83* (2013.01); *H01L 24/92* (2013.01); *H01L 24/13* (2013.01); *H01L 24/16* (2013.01); *H01L 24/32* (2013.01); *H01L 24/94* (2013.01); *H01L 2224/131* (2013.01); *H01L 2224/16227* (2013.01); *H01L 2224/271* (2013.01); *H01L 2224/27003* (2013.01); *H01L 2224/2732* (2013.01); *H01L 2224/27312* (2013.01); *H01L 2224/27416* (2013.01); *H01L 2224/27436* (2013.01); *H01L 2224/2919* (2013.01); *H01L 2224/2929* (2013.01); *H01L 2224/2949* (2013.01); *H01L 2224/29294* (2013.01); *H01L 2224/29387* (2013.01); *H01L 2224/32225* (2013.01); *H01L 2224/73104* (2013.01); *H01L 2224/73204* (2013.01); *H01L 2224/8113* (2013.01); *H01L 2224/81132* (2013.01); *H01L 2224/81191* (2013.01); *H01L 2224/81203* (2013.01); *H01L 2224/81444* (2013.01); *H01L 2224/81801* (2013.01); *H01L 2224/81815* (2013.01); *H01L 2224/83091* (2013.01); *H01L 2224/83191* (2013.01); *H01L 2224/83192* (2013.01);
(Continued)

(58) Field of Classification Search
CPC ... H01L 24/83; H01L 24/49; H01L 21/76841; H01L 24/81; H01L 24/17; H01L 24/29; H01L 21/563; H01L 24/27; H01L 24/73; H01L 24/92
See application file for complete search history.

(56) References Cited

U.S. PATENT DOCUMENTS

| | | |
|---|---|---|
| 5,985,043 A | 11/1999 | Zhou |
| 6,338,195 B1 | 1/2002 | Tsukagoshi |

(Continued)

FOREIGN PATENT DOCUMENTS

| | | |
|---|---|---|
| JP | 2004-311709 | 11/2004 |
| JP | 2009-4462 | 1/2009 |

(Continued)

OTHER PUBLICATIONS

International Search Report issued Oct. 29, 2013 in International (PCT) Application No. PCT/JP2013/071167.

(Continued)

*Primary Examiner* — Alonzo Chambliss
(74) *Attorney, Agent, or Firm* — Wenderoth, Lind & Ponack, L.L.P.

(57) ABSTRACT

The present invention aims to provide a method for producing a semiconductor device, the method being capable of achieving high reliability by suppressing voids. The present invention also aims to provide a flip-chip mounting adhesive for use in the method for producing a semiconductor device. The present invention relates to a method for producing a semiconductor device, including: step 1 of positioning a semiconductor chip on a substrate via an adhesive, the semiconductor chip including bump electrodes each having an end made of solder; step 2 of heating the semiconductor chip at a temperature of the melting point of the solder or higher to solder and bond the bump electrodes of the semiconductor chip to an electrode portion of the substrate, and concurrently to temporarily attach the adhesive; and step 3 of removing voids by heating the adhesive under a pressurized atmosphere, wherein the adhesive has an activation energy $\Delta E$ of 100 kJ/mol or less, a reaction rate of 20% or less at 2 seconds at 260° C., and a reaction rate of 40% or less at 4 seconds at 260° C., as determined by differential scanning calorimetry and Ozawa method.

12 Claims, No Drawings

(52) U.S. Cl.
CPC ............ *H01L 2224/83203* (2013.01); *H01L 2224/83204* (2013.01); *H01L 2224/83855* (2013.01); *H01L 2224/83862* (2013.01); *H01L 2224/83907* (2013.01); *H01L 2224/83986* (2013.01); *H01L 2224/9205* (2013.01); *H01L 2224/9211* (2013.01); *H01L 2224/92125* (2013.01); *H01L 2224/94* (2013.01); *H01L 2924/0665* (2013.01); *H01L 2924/12042* (2013.01); *H01L 2924/20106* (2013.01); *H01L 2924/3512* (2013.01); *H01L 2924/3841* (2013.01)

(56) References Cited

U.S. PATENT DOCUMENTS

| | | | |
|---|---|---|---|
| 6,566,234 | B1 | 5/2003 | Capote |
| 7,915,743 | B2 | 3/2011 | Ishizawa |
| 9,209,155 | B2 * | 12/2015 | Wakioka ............... C09J 163/00 |
| 2002/0014703 | A1 | 2/2002 | Capote |
| 2003/0059978 | A1 | 3/2003 | Suzuki |
| 2004/0079464 | A1 | 4/2004 | Kumakura |
| 2007/0031735 | A1 | 2/2007 | Nishimura |
| 2009/0311827 | A1 | 12/2009 | Ishizawa |
| 2011/0122590 | A1 | 5/2011 | Wilson |
| 2014/0015149 | A1 | 1/2014 | Honda |

FOREIGN PATENT DOCUMENTS

| | | |
|---|---|---|
| JP | 4640380 | 1/2009 |
| JP | 2011-29350 | 2/2011 |
| JP | 2012-89571 | 5/2012 |

OTHER PUBLICATIONS

Office Action issued Feb. 25, 2016 in corresponding European Application No. 13827102.8.
Ozawa T: "A New Method of Analyzing Thermogravimetric Data", Bulletin of the Chemical Society of Japan, vol. 38, No. 11, 1965, pp. 1881-1886.
Ozawa T: "Hi teion sokudo-ron (Non-isothermal kinetics)", Netsu Sokutei (Calorimetry and Thermal Analysis), vol. 1, No. 1-2, 1974, pp. 2-12, with machine translation.
Extended European Search Report dated Jun. 17, 2016, in European Application No. 13827102.8.
Operation User's Manual, 0503-Y81-004, Ver. 1.0, Nov. 2008 (partial translation).
"Reaction Rate," Wikipedia, the Free Encyclopedia, pp. 1-7, https://ert.wikipedia.org/w/index.php?title=Reaction_rate&oldid=502206663 (Jul. 14, 2012).

* cited by examiner

ADHESIVE FOR MOUNTING FLIP CHIP FOR USE IN A METHOD FOR PRODUCING A SEMICONDUCTOR DEVICE

TECHNICAL FIELD

The present invention relates to a method for producing a semiconductor device, the method being capable of achieving high reliability by suppressing voids. The present invention also relates to a flip-chip mounting adhesive for use in the method for producing a semiconductor device.

BACKGROUND ART

Along with the development of smaller and higher-density semiconductor devices, flip-chip mounting that uses a semiconductor chip having many bump electrodes on its surface has been drawing attention and rapidly spreading as a method for mounting a semiconductor chip on a substrate.

In flip-chip mounting, a commonly employed method for ensuring connection reliability of a bonded portion is one in which a liquid sealing adhesive (underfill) is injected into a gap between a semiconductor chip and a substrate after bonding bump electrodes of the semiconductor chip to an electrode portion of the substrate, and the adhesive is cured. Unfortunately, flip-chip mounting that uses underfill has the following drawbacks: manufacturing cost is high; underfill injection takes time; there are limitations on narrowing the distance between the electrodes as well as the distance between the semiconductor chip and the substrate; and the like.

Consequently, so-called "precoating-type flip-chip mounting" has been suggested in recent years, which includes, for example, a method for mounting a semiconductor chip on a substrate after a paste-like adhesive is applied to the substrate; and a method for mounting an adhesive-applied semiconductor chip on a substrate after a film-like or paste-like adhesive is supplied to a semiconductor wafer or semiconductor chip. In particular, the method for mounting an adhesive-applied semiconductor chip is expected to achieve a significantly shortened process because adhesive-applied semiconductor chips can be mass-produced in a lump by supplying an adhesive to a semiconductor wafer in a lump and by dicing.

However, in precoating-type flip-chip mounting, voids may result from entrapped air between the semiconductor chip or substrate and the adhesive when the bump electrodes of the semiconductor chip are brought into contact with the electrode portion of the substrate; or voids may result from a component volatilized from the adhesive during a thermal compression step when the semiconductor chip is mounted on the substrate. These voids can cause a short circuit between electrodes or cracks in the adhesive. In addition, in precoating-type flip-chip mounting, because bonding of the bump electrodes and thermal curing of the adhesive are performed at the same time in the thermal compression step, it is difficult to achieve high-precision bonding of the bump electrodes and suppression of voids at the same time.

In order to suppress voids, the following methods have been suggested, for example: a method for contracting voids by thermally curing the adhesive under a pressurized atmosphere; and a method for decreasing voids by temporarily bonding a semiconductor chip to a substrate, and then heating the temporarily bonded structure under a pressurized atmosphere (for example, Patent Literatures 1 to 3). Yet, even these methods cannot sufficiently suppress voids because air is easily entrapped due to the roughness of the substrate particularly in the case of mounting the adhesive-applied semiconductor chip on the substrate.

CITATION LIST

Patent Literature

Patent Literature 1: JP-A 2004-311709
Patent Literature 2: JP-A 2009-004462
Patent Literature 3: Japanese Patent No. 4640380

SUMMARY OF INVENTION

Technical Problem

The present invention aims to provide a method for producing a semiconductor device, the method being capable of achieving high reliability by suppressing voids. The present invention also aims to provide a flip-chip mounting adhesive for use in the method for producing a semiconductor device.

Solution to Problem

The present invention relates to a method for producing a semiconductor device, including: step 1 of positioning a semiconductor chip on a substrate via an adhesive, the semiconductor chip including bump electrodes each having an end made of solder; step 2 of heating the semiconductor chip at a temperature of the melting point of the solder or higher to solder and bond the bump electrodes of the semiconductor chip to an electrode portion of the substrate, and concurrently to temporarily attach the adhesive; and step 3 of removing voids by heating the adhesive under a pressurized atmosphere, wherein the adhesive has an activation energy $\Delta E$ of 100 kJ/mol or less, a reaction rate of 20% or less at 2 seconds at 260° C., and a reaction rate of 40% or less at 4 seconds at 260° C., as determined by differential scanning calorimetry and Ozawa method.

The present invention is described in detail below.

In order to achieve both high-precision bonding of the bump electrodes and suppression of voids, the present inventors examined a method for heating a semiconductor chip at a temperature of the melting point of the solder or higher to reliably bond bump electrodes of the semiconductor chip to an electrode portion of a substrate, and subsequently heating the adhesive under a pressurized atmosphere to remove voids. Unfortunately, the above method cannot sufficiently remove voids even when the adhesive is heated under a pressurized atmosphere, if the curing of the adhesive has proceeded too far during bonding of the bump electrodes.

It may be possible to suppress curing of the adhesive by adjusting bonding conditions of the bump electrodes. Yet, because bonding of the bump electrodes requires the temperature to be maintained at a temperature of the melting point of the solder or higher (about 240° C. to 280° C.), there are limitations on suppressing curing of the adhesive merely by adjusting the bonding conditions.

Thus, the adhesive must be one whose curing is suppressed as much as possible even after the adhesive experienced a thermal history during bonding of the bump electrodes. In other words, an adhesive having a relatively slow cure rate (kinetics) must be used. Unfortunately, conventional methods for evaluating the kinetics of the adhesive lack objectivity or quantitativeness.

Meanwhile, in the fields of thermal analysis, kinetics analysis, and the like, an analysis method called "Ozawa method" is known, which determines the activation energy ΔE and the time it takes to reach a certain reaction rate at a constant temperature from data obtained by differential scanning calorimetry (DSC measurement) of a sample.

The present inventors examined application of Ozawa method to an adhesive used in a method for producing a semiconductor device. As a result, the present inventors found that the reaction rate of an adhesive that is kept at a constant temperature for a certain period of time can be evaluated with more objectivity and quantitativeness by differential scanning calorimetry and Ozawa method, and that both high-precision bonding of bump electrodes and suppression of voids can be achieved using an adhesive having an activation energy ΔE, a reaction rate at 2 seconds at 260° C., and a reaction rate at 4 seconds at 260° C. in predetermined ranges, as determined by the above methods. The present invention was accomplished based on such findings.

The method for producing a semiconductor device of the present invention includes step 1 of positioning a semiconductor chip on a substrate via an adhesive, the semiconductor chip including bump electrodes each having an end made of solder. In step 1 of positioning, usually, a mounting device such as a flip chip bonder is used, and the positions of the bump electrodes of the semiconductor chip, an electrode portion of the substrate, and alignment marks provided on the semiconductor chip and the substrate are recognized by a camera. Thereby, the semiconductor chip is automatically positioned on the substrate in X and Y directions as well as a rotational direction (θ direction).

Examples of the semiconductor chip include a semiconductor chip made of a semiconductor material such as silicon and gallium arsenide, in which bump electrodes each having an end made of solder are formed on the surface. Each bump electrode having an end made of solder may be either such that a part of the bump electrode is made of solder or the entire bump electrode is made of solder, as long as the end is made of solder.

Examples of the method for supplying the adhesive include, but not limited to, a method in which a film-like adhesive is adhered to the substrate or the semiconductor chip, and a method in which a paste-like adhesive is poured into a syringe, and a precise nozzle is attached to the syringe tip so as to discharge the adhesive onto the substrate using a dispenser.

Alternatively, it is also possible to employ a method in which a film-like adhesive is adhered in advance to a wafer, for example, by lamination under atmospheric pressure or vacuum, or a paste-like adhesive is applied in advance by spin coating or the like or printed onto a wafer to form a coating film, and then the wafer is singulated by blade dicing, laser dicing, or the like into semiconductor chips. Air may be entrapped in the case of lamination under atmospheric pressure. In such a case, voids may be removed by heating the adhesive under a pressurized atmosphere using a pressure oven (for example, PCO-083TA (available from NTT Advanced Technology Corporation)) or the like, which is similar to that used in step 3 of removing voids.

The adhesive has an activation energy ΔE of 100 kJ/mol or less, a reaction rate of 20% or less at 2 seconds at 260° C., and a reaction rate of 40% or less at 4 seconds at 260° C., as determined by differential scanning calorimetry and Ozawa method.

The adhesive having an activation energy ΔE, a reaction rate at 2 seconds at 260° C., and a reaction rate at 4 seconds at 260° C. in the above ranges, as determined by differential scanning calorimetry and Ozawa method, is considered to be an adhesive in which curing is suppressed as much as possible even after the adhesive experienced a thermal history during bonding of the bump electrodes in step 2 of temporarily attaching the adhesive, and in which uneven curing is also suppressed, because the adhesive has relatively slow cure rate (kinetics) and the temperature dependence of the kinetics is small. The use of such an adhesive can achieve both precision bonding of the bump electrodes and suppression of voids by reliably bonding the bump electrodes in step 2 of temporarily attaching the adhesive and then by performing step 3 of removing voids.

Differential scanning calorimetry can be carried out using a DSC device (for example, DSC6220 (available from SII NanoTechnology Inc.)). In addition, Ozawa method can be carried out using software for kinetics analysis (available from SII NanoTechnology Inc., for example), and refers to an analysis method described below.

First, differential scanning calorimetry is carried out three times or more for a sample at different heating rates, and the reciprocal of the temperature T and the logarithm of the heating rate B (log B) are plotted. Then, the activation energy ΔE is calculated from the slope of the straight line obtained above, based on the following equation (1). Next, the reaction rate of the sample that is kept at 260° C. for 2 seconds, as well as at 260° C. for 4 seconds, is calculated from the activation energy ΔE, based on the following equation (2) for degradation at a constant temperature (see Takeo Ozawa, Heat Measurement 1, 2 (1974), and T. Ozawa, Bull. Chem. Soc. Japan 38, 1881 (1965)).

[Math 1]

$$\log B - 0.4567 \Delta E / RT = const. \quad (1)$$

$$\tau = \frac{\int \exp(-\Delta E / RT) dT}{B \exp(-\Delta E / RT)} \quad (2)$$

In the equation (2), τ indicates the degradation time at a constant temperature.

If the activation energy ΔE exceeds 100 kJ/mol, the temperature dependence of the kinetics of the adhesive will increase, causing the adhesive to be easily affected by variation in temperature, in-plane temperature distribution, and the like in step 2 of temporarily attaching the adhesive. As a result, it will be difficult to control voids or to prevent the adhesive from being trapped between the upper and lower electrodes. The activation energy ΔE is preferably 90 kJ/mol or less, more preferably 80 kJ/mol or less.

The lower limit of the activation energy ΔE is not particularly limited, but is preferably 50 kJ/mol. If the activation energy ΔE is less than 50 kJ/mol, the curing of the adhesive will easily proceed even at a relatively low temperature, and the adhesive may have poor storage stability.

If the reaction rate at 2 seconds at 260° C. exceeds 20% or the reaction rate at 4 seconds at 260° C. exceeds 40%, the curing of the adhesive will unfortunately proceed in step 2 of temporarily attaching the adhesive, resulting in insufficient removal of voids in step 3 of removing voids; or the curing of the adhesive may proceed before the bump electrodes are soldered and bonded in step 2 of temporarily attaching the adhesive, causing the adhesive to be trapped between the upper and lower electrodes, which in turn results in defective bonding. The reaction rate at 2 seconds at 260° C. is preferably 15% or less, more preferably 12% or less. The reaction rate at 4 seconds at 260° C. is preferably 30% or less, more preferably 25% or less.

The lower limit of the reaction rate at 2 seconds at 260° C. is not particularly limited, but is preferably 3%. The lower limit of the reaction rate at 4 seconds at 260° C. is not particularly limited, but is preferably 10%. If the reaction rate at 2 seconds at 260° C. is less than 3% or the reaction rate at 4 seconds at 260° C. is less than 10%, the adhesive may take time to be cured, and the semiconductor device may not be produced in a short period of time.

The adhesive may be either film-like or paste-like, but a film-like adhesive is particularly preferred.

In the case where the adhesive is paste-like, the adhesive must be supplied to each portion corresponding to a semiconductor chip on a substrate. In contrast, in the case where the adhesive is film-like, adhesive-applied semiconductor chips can be mass-produced in a lump by supplying the adhesive to a substrate or a wafer in a lump and dicing, which is thus expected to achieve a significantly shortened process.

In addition, a film-like adhesive usually has high melt viscosity so that it is difficult to achieve both high-precision bonding of the bump electrodes and suppression of voids using a film-like adhesive. In contrast, according to the method for producing a semiconductor device of the present invention, the use of an adhesive having an activation energy $\Delta E$, a reaction rate at 2 seconds at 260° C., and a reaction rate at 4 seconds at 260° C. in the above ranges, as determined by differential scanning calorimetry and Ozawa method, can achieve both precision bonding of the bump electrodes and suppression of voids, even if the adhesive is film-like.

The adhesive preferably contains at least a thermosetting resin and a thermosetting agent, and preferably further contains a curing accelerator.

The activation energy $\Delta E$ is inherent in the reaction system, so that the activation energy $\Delta E$ of the adhesive can be adjusted within the above range, for example, by selecting the types of the thermosetting resin, thermosetting agent, curing accelerator, and the like to be combined.

Meanwhile, the kinetics also has a dependency on the concentration of the reaction system, so that the reaction rate of the adhesive can be adjusted within the above range by adjusting the amount of each component (particularly, curing accelerator). Specifically, a larger amount of curing accelerator tends to result in faster kinetics, and a smaller amount of curing accelerator tends to result in slower kinetics. Yet, because an appropriate amount of curing accelerator differs depending on each reaction system, the amount of each component must be suitably adjusted in order to adjust the reaction rate of the adhesive within the above range.

Examples of the thermosetting resin include, but not limited to, compounds that are cured by reactions such as addition polymerization, polycondensation, polyaddition, addition condensation, and ring-opening polymerization. Specific examples of the thermosetting resin include urea resins, melamine resins, phenolic resins, resorcinol resins, epoxy resins, acrylic resins, polyester resins, polyamide resins, polybenzimidazole resins, diallylphthalate resins, xylene resins, alkylbenzene resins, epoxyacrylate resins, silicone resins, and urethane resins. Among these, epoxy resins are preferred for easy adjustment of the activation energy $\Delta E$ and the reaction rate of the adhesive within the above ranges, and for physical properties and the like of the cured product.

The epoxy resins preferably have a low concentration of functional groups, i.e., a high epoxy equivalent weight. An epoxy resin having a high epoxy equivalent weight exhibits low reaction probability and low reactivity with the thermosetting agent, so that the use of such an epoxy resin allows the reaction rate of the adhesive to be easily adjusted within the above range. The epoxy equivalent weight of the epoxy resins is preferably 200 or more, more preferably 250 or more.

Examples of the epoxy resins include, but not limited to, bisphenol-type epoxy resins such as a bisphenol A-type epoxy resin, a bisphenol F-type epoxy resin, a bisphenol AD-type epoxy resin, and a bisphenol S-type epoxy resin; novolak-type epoxy resins such as a phenol novolak-type epoxy resin and a cresol novolak-type epoxy resin; resorcinol-type epoxy resins; aromatic epoxy resins such as trisphenolmethane triglycidyl ether; naphthalene-type epoxy resins; fluorene-type epoxy resins; cyclopentadiene-type epoxy resins; dicyclopentadiene-type epoxy resins; polyether-modified epoxy resins; NBR-modified epoxy resins; CTBN-modified epoxy resins; and hydrogenated products thereof. Among these, cyclopentadiene-type epoxy resins and dicyclopentadiene-type epoxy resins having a bulky structure are preferred. The cyclopentadiene-type epoxy resins or dicyclopentadiene-type epoxy resins have a large steric hindrance and low reactivity, so that the use of these epoxy resins allows the reaction rate of the adhesive to be easily adjusted within the above range. These epoxy resins may be used alone or in combination of two or more thereof.

These epoxy resins may be liquid at room temperature or solid at room temperature, and liquid and solid epoxy resins at room temperature may be used in an appropriate combination.

Among the epoxy resins that are liquid at room temperature, examples of commercially available products include bisphenol A-type epoxy resins such as EPICLON 840, 840-S, 850, 850-S, and EXA-850CRP (all available from DIC Corporation); bisphenol F-type epoxy resins such as EPICLON 830, 830-S, and EXA-830CRP (all available from DIC Corporation); naphthalene-type epoxy resins such as EPICLON HP-4032 and HP-4032D (all available from DIC Corporation); hydrogenated bisphenol A-type epoxy resins such as EPICLON EXA-7015 (available from DIC Corporation) and EX-252 (available from Nagase ChemteX Corporation); and resorcinol-type epoxy resins such as EX-201 (available from Nagase ChemteX Corporation).

Among the epoxy resins that are solid at room temperature, examples of commercially available products include bisphenol A-type epoxy resins such as EPICLON 860, 10550, and 1055 (all available from DIC Corporation); bisphenol S-type epoxy resins such as EPICLON EXA-1514 (available from DIC Corporation); naphthalene-type epoxy resins such as EPICLON HP-4700, HP-4710, and HP-4770 (all available from DIC Corporation); dicyclopentadiene-type epoxy resins such as EPICLON HP-7200 series (available from DIC Corporation); and cresol novolak-type epoxy resins such as EPICLON HP-5000 and EXA-9900 (all available from DIC Corporation).

The thermosetting agent is not particularly limited, and any conventionally known thermosetting agent can be suitably selected according to the thermosetting resin. In the case of using an epoxy resin as the thermosetting resin, examples of the thermosetting agent include acid anhydride curing agents; phenolic curing agents; amine curing agents; latent curing agents such as dicyandiamide; and cationic catalyst-type curing agents. These thermosetting agents may be used alone or in combination of two or more thereof.

Among these, the acid anhydride curing agents are preferred for excellent physical properties and the like of the cured product.

Among the acid anhydride curing agents, examples of commercially available products include YH-306 and YH-307 (all available from Mitsubishi Chemical Corporation, liquid at room temperature (25° C.)), and YH-309 (available from Mitsubishi Chemical Corporation, an acid anhydride curing agent, solid at room temperature (25° C.)).

The amount of the thermosetting agent is not particularly limited. In the case of using an epoxy resin as the thermosetting resin and a thermosetting agent that reacts with an equimolar amount of epoxy groups, the lower limit of the amount of the thermosetting agent is preferably 60 equivalents relative to the total amount of epoxy groups in the adhesive, and the upper limit thereof is preferably 110 equivalents. If the amount is less than 60 equivalents, the adhesive may not be sufficiently cured. An amount of more than 110 equivalents does not particularly contribute to the curability of the adhesive, and voids may result from volatilization of an excessive amount of thermosetting agent. The lower limit of the amount is more preferably 70 equivalents, and the upper limit thereof is more preferably 100 equivalents.

Examples of the curing accelerator include, but not limited to, imidazole curing accelerators and tertiary amine curing accelerators. Among these, imidazole curing accelerators are preferred for easy adjustment of the reaction rate of the adhesive within the above range, and for easy control of the reaction system for adjusting the physical properties of the cured product.

Examples of the imidazole curing accelerators include, but not limited to, Fujicure 7000 (available from T&K TOKA Corporation, liquid at room temperature (25° C.)), 1-cyanoethyl-2-phenylimidazole in which the 1-position of imidazole is protected by a cyanoethyl group, and imidazole curing accelerators in which the basicity is protected by isocyanuric acid (trade name "2MA-OK" available from SHIKOKU CHEMICALS CORPORATION, solid at room temperature (25° C.)), 2MZ, 2MZ-P,2PZ, 2PZ-PW, 2P4MZ, C11Z-CNS,2PZ-CNS, 2PZCNS-PW, 2MZ-A, 2MZA-PW, C11Z-A, 2E4MZ-A, 2MAOK-PW, 2PZ-OK, 2MZ-OK, 2PHZ, 2PHZ-PW, 2P4MHZ, 2P4MHZ-PW, 2E4MZ.BIS, VT, VT-OK, MAVT, and MAVT-OK (all available from SHIKOKU CHEMICALS CORPORATION). These imidazole curing accelerators may be used alone or in combination of two or more thereof.

The amount of the curing accelerator is not particularly limited, but the lower limit relative to 100 parts by weight of the thermosetting agent is preferably 0.5 parts by weight, and the upper limit thereto is preferably 50 parts by weight. If the amount is less than 0.5 parts by weight, the adhesive may need to be heated at high temperatures for a long period of time to be thermally cured. If the amount exceeds 50 parts by weight, the storage stability of the adhesive may be insufficient, or voids may result from volatilization of an excessive amount of curing accelerator. The lower limit of the amount is more preferably 1 part by weight, and the upper limit thereof is more preferably 30 parts by weight.

In the case where the adhesive is a film-like adhesive, the adhesive preferably further contains a high molecular weight compound. The use of the high molecular weight compound can impart film-forming properties, flexibility, and the like to the adhesive, impart toughness to the cured product of the adhesive, and ensure high bonding reliability.

Examples of the high molecular weight compound include, but not limited to, publicly known high molecular weight compounds such as urea resins, melamine resins, phenolic resins, resorcinol resins, epoxy resins, acrylic resins, polyester resins, polyamide resins, polybenzimidazole resins, diallylphthalate resins, xylene resins, alkylbenzene resins, epoxyacrylate resins, silicone resins, and urethane resins. Among these, a high molecular weight compound having an epoxy group is preferred.

The addition of the high molecular weight compound having an epoxy group allows the cured product of the adhesive to exhibit excellent flexibility. In other words, the cured product of the adhesive will have excellent mechanical strength, heat resistance, and moisture resistance derived from the epoxy resin as the thermosetting resin, as well as excellent flexibility derived from the high molecular weight compound having an epoxy group. Thus, the cured product will be excellent in resistance to heating/cooling cycle, resistance to solder reflow, dimensional stability, and the like, and will exhibit high bonding reliability and high conduction reliability.

The high molecular weight compound having an epoxy group may be any high molecular weight compound having an epoxy group at the terminal and/or in the side chain (pendant position). Examples thereof include epoxy group-containing acrylic rubber, epoxy group-containing butadiene rubber, bisphenol-type high molecular weight epoxy resins, epoxy group-containing phenoxy resins, epoxy group-containing acrylic resins, epoxy group-containing urethane resins, and epoxy group-containing polyester resins. Among these, epoxy group-containing acrylic resins are preferred for obtainment of a high molecular compound having many epoxy groups and for better mechanical strength and heat resistance of the cured product. These high molecular weight compounds having an epoxy group may be used alone or in combination of two or more thereof.

In the case of using the high molecular weight compound having an epoxy group (in particular, an epoxy group-containing acrylic resin) as the high molecular weight compound, the lower limit of the weight average molecular weight of the high molecular weight compound having an epoxy group is preferably 10000, and the upper limit thereof is preferably 1000000. If the weight average molecular weight is less than 10000, the film-forming properties of the adhesive may be insufficient, or the flexibility of the cured product of the adhesive may not be sufficiently improved. If the weight average molecular weight exceeds 1000000, it may be difficult to supply the adhesive to obtain a constant thickness in step 1 of positioning; or the fluidity of the adhesive may decrease due to its excessively increased melt viscosity, resulting in insufficient removal of voids in step 3 of removing voids.

In the case of using the high molecular weight compound having an epoxy group (in particular, an epoxy group-containing acrylic resin) as the high molecular weight compound, the high molecular weight compound having an epoxy group preferably has a low concentration of functional groups, i.e., a high epoxy equivalent weight. A high molecular weight compound having a high epoxy equivalent weight exhibits low reactivity, so that the use of such a high molecular weight compound allows the reaction rate of the adhesive to be easily adjusted within the above range. The epoxy equivalent weight of the high molecular weight compound having an epoxy group is preferably 200 or more, more preferably 250 or more.

The amount of the high molecular weight compound in the adhesive is not particularly limited, but the lower limit is preferably 3% by weight, and the upper limit is preferably 30% by weight. If the amount is less than 3% by weight, the reliability against thermal strain may be insufficient. If the amount exceeds 30% by weight, the adhesive may have low heat resistance.

The adhesive preferably further contains an inorganic filler. The amount of the inorganic filler is preferably 60% by weight or less. If the amount exceeds 60% by weight, the fluidity of the adhesive may decrease, resulting in insufficient removal of voids in step 3 of removing voids.

The lower limit of the amount of the inorganic filler in the adhesive is not particularly limited, but is preferably 10% by weight for ensuring strength and bonding reliability of the cured product of the adhesive.

Examples of the inorganic filler include, but not limited to, silica, alumina, aluminum nitride, boron nitride, silicon nitride, silicon carbide, magnesium oxide, and zinc oxide. Among these, spherical silica is preferred because of its excellent fluidity, and spherical silica that has been surface treated with a methylsilane coupling agent, a phenylsilane coupling agent, or the like is more preferred. The use of surface-treated spherical silica can suppress an increase in the viscosity of the adhesive, and can result in very efficient removal of voids in step 3 of removing voids.

The average particle size of the inorganic filler is not particularly limited but is preferably about 0.01 to 1 µm for transparency, fluidity, bonding reliability, and the like of the adhesive.

The adhesive may further contain other additives, if necessary, such as diluents, thixotropy-imparting agents, solvents, inorganic ion exchangers, bleed preventing agents, tackifiers such as an imidazolesilane coupling agent, adhesion-imparting agent, and stress relaxing agents such as rubber particles.

Examples of the method for producing the adhesive include, but not limited to, a method in which a curing accelerator, a high molecular weight compound, an inorganic filler, and other additives are added, if needed, in certain amounts to the thermosetting resin and the thermosetting agent and mixed together. Examples of the method for mixing include, but not limited to, a method in which a homodisper, a versatile mixer, a Banbury mixer, a kneader, a bead mill, a homogenizing disperser, or the like is used.

The lower limit of the minimum melt viscosity of the adhesive in a temperature range from room temperature to the melting point of the solder is preferably 10 Pa·s, and the upper limit thereof is preferably $10^4$ Pa·s. If the minimum melt viscosity is less than 10 Pa·s, the adhesive may contaminate other devices due to excessive protruding fillets. If the minimum melt viscosity exceeds $10^4$ Pa·s, voids may not be sufficiently removed.

The minimum melt viscosity of the adhesive in a temperature range from room temperature to the melting point of the solder can be measured with a rheometer.

In the method for producing a semiconductor device of the present invention, step 2 is subsequently performed in which the semiconductor chip is heated at a temperature of the melting point of the solder or higher to solder and bond the bump electrodes of the semiconductor chip to an electrode portion of the substrate, and concurrently to temporarily attach the adhesive.

Step 2 of temporarily attaching the adhesive is also usually performed using a mounting device such as a flip chip bonder.

The melting point of the solder is usually in the range of about 215° C. to 235° C. The lower limit of the temperature of the melting point of the solder or higher is preferably 240° C., and the upper limit thereof is preferably 300° C. If the temperature is lower than 240° C., the bump electrodes may not be sufficiently soldered, failing to form a bond between the electrodes. If the temperature exceeds 300° C., voids may increase due to a component volatilized from the adhesive. In addition, the curing of the adhesive may unfortunately proceed, and the fluidity of the adhesive may decrease, resulting in insufficient removal of voids in step 3 of removing voids.

The lower limit of the time (duration) to heat the adhesive-applied semiconductor chip at a temperature of the melting point of the solder or higher is preferably 0.1 second, and the upper limit thereof is preferably 5 seconds. If the duration is less than 0.1 second, the bump electrodes may not be sufficiently soldered, failing to form a bond between the electrodes. If the duration exceeds 5 seconds, voids may increase due to a component volatilized from the adhesive. In addition, the curing of the adhesive may unfortunately proceed, and the fluidity of the adhesive may decrease, resulting in insufficient removal of voids in step 3 of removing voids.

In step 2 of temporarily attaching the adhesive, it is preferred to apply pressure to the semiconductor chip. The pressure is not particularly limited as long as a bond between the electrodes is formed at that pressure, but is preferably 0.3 to 3 MPa.

According to the method for producing a semiconductor device of the present invention, subsequently, step 3 of removing voids by heating the adhesive under a pressurized atmosphere is performed.

The phrase "under a pressurized atmosphere" means "under an atmosphere of a pressure higher than ordinary pressure (atmospheric pressure)". It is considered that step 3 of removing voids not only prevents the growth of voids but also can positively remove voids. Thus, the method for producing a semiconductor device of the present invention can remove voids even if air is entrapped in the adhesive.

Examples of the method for heating the adhesive under a pressurized atmosphere include a method in which a pressure oven (for example, PCO-083TA (available from NTT Advanced Technology Corporation)) is used.

The lower limit of the pressure of the pressure oven is preferably 0.2 MPa, and the upper limit thereof is preferably 10 MPa. If the pressure is less than 0.2 MPa, voids may not be sufficiently removed. If the pressure exceeds 10 MPa, the adhesive itself may be deformed, adversely affecting the reliability of the semiconductor device. The lower limit of the pressure is more preferably 0.3 MPa, and the upper limit thereof is more preferably 1 MPa.

The lower limit of the heating temperature while heating the adhesive under a pressurized atmosphere is preferably 60° C., and the upper limit thereof is preferably 150° C. While the adhesive is heated under a pressurized atmosphere, the temperature and the pressure may be maintained at constant values, or the temperature and/or pressure may be changed stepwise by increasing the temperature and/or pressure.

In addition, in order to more reliably remove voids, the heating time to heat the adhesive under a pressurized atmosphere is preferably at least 10 minutes.

According to the method for producing a semiconductor device of the present invention, step 3 of removing voids may be followed by step 4 of completely curing the adhesive.

Examples of the method for completely curing the adhesive, which is performed after step 3 of removing voids, include a method in which the adhesive is completely cured by increasing the temperature under a pressurized atmosphere; and a method in which the adhesive is completely cured by heating under ordinary pressure. The heating temperature for completely curing the adhesive is not particularly limited, but is preferably about 150° C. to 200° C.

According to the method for producing a semiconductor device of the present invention, it is possible to achieve both precision bonding of the bump electrodes and suppression of voids by reliably bonding the bump electrodes in step 2 of temporarily attaching the adhesive and then by performing step 3 of removing voids, by the use of the adhesive having an activation energy ΔE, a reaction rate at 2 seconds at 260° C., and a reaction rate at 4 seconds at 260° C. in the above ranges, as determined by differential scanning calorimetry and Ozawa method. Another aspect of the present invention is a flip-chip mounting adhesive for use in the method for producing a semiconductor device of the present invention, the adhesive having an activation energy ΔE, a reaction rate at 2 seconds at 260° C., and a reaction rate at 4 seconds at 260° C. in the above ranges, as determined by differential scanning calorimetry and Ozawa method.

Advantageous Effects of Invention

The present invention can provide a method for producing a semiconductor device, the method being capable of achieving high reliability by suppressing voids. The present invention can also provide a flip-chip mounting adhesive for use in the method for producing a semiconductor device.

DESCRIPTION OF EMBODIMENTS

Embodiments of the present invention are described in further detail below with reference to examples, but the present invention is not limited to these examples.

EXAMPLES 1 TO 5 AND COMPARATIVE EXAMPLES 1 to 5

(1) Preparation of Adhesive

The ingredients shown in Table 1 were added to MEK as a solvent in accordance with the blending ratio shown in Table 2, and these ingredients were mixed by stirring using a homodisper to prepare an adhesive solution. The thus-obtained adhesive solution was applied to a release PET film using an applicator to give a dried thickness of 30 μm and dried to prepare a film-like adhesive. The surface of the thus-obtained adhesive layer was protected with the release PET film (protection film) until use.

(2) Differential Scanning Calorimetry and Ozawa Method

Differential scanning calorimetry was carried out for the thus-obtained adhesive at four different heating rates of 1° C., 2° C., 5° C., and 10° C./min, and the reciprocal of the temperature T and the logarithm of the heating rate B (log B) were plotted. Then, the activation energy ΔE was calculated from the slope of the straight line obtained above, based on the above equation (1). Next, the reaction rate of the sample that was kept at 260° C. for 2 seconds, as well as at 260° C. for 4 seconds, was calculated from the activation energy ΔE, based on the above equation (2) for degradation at a constant temperature.

Note that DSC6220 (available from SII NanoTechnology Inc.) and software for kinetics analysis (available from SII NanoTechnology Inc.) were used.

(3) Production of Semiconductor Device (3-1) Step 1 of Positioning and Step 2 of Temporarily Attaching the Adhesive A semiconductor chip having bump electrodes each having an end made of solder (WALTS MB50-0101JY, melting point of the solder of 235° C., thickness of 100 μm, available from WALTS CO., LTD.), and a substrate having an Ni/Au electrode (WALTS-KIT MB50-0101JY available from WALTS CO., LTD.) were provided. A protection film on one side of the adhesive was peeled off, and the adhesive was adhered to the semiconductor chip at a stage temperature of 80° C. and a vacuum degree of 80 Pa, using a vacuum laminator (ATM-812M available from Takatori Corporation).

Using a flip chip bonder (FC-3000S available from Toray Engineering Co., Ltd.), the semiconductor chip was positioned on the substrate via the adhesive (step 1), and the bonding stage temperature was set to 120° C. Under such conditions, the temperature was increased to 260° C. at a contact temperature of 160° C., and a pressure of 0.8 MPa was applied for 2 seconds to solder and bond the bump electrodes of the semiconductor chip to the electrode portion of the substrate, and concurrently to temporarily attach the adhesive (step 2).

(3-2) Step 3 of Removing Voids

The thus-obtained temporarily attached body was placed in a pressure oven (PCO-083TA available from NTT Advanced Technology Corporation) to heat the adhesive under a pressurized atmosphere under the following pressure and heating conditions so as to remove voids (step 3), and the adhesive was completely cured to obtain a semiconductor device.

<Pressure and Heating Conditions>

STEP 1: heating at a constant rate from 25° C. to 80° C. for 10 minutes, 0.5 MPa STEP 2: conditions maintained at 80° C. for 60 minutes, 0.5 MPa STEP 3: heating at a constant rate from 80° C. to 170° C., 0.5 MPa STEP 4: conditions maintained at 170° C. for 10 minutes, 0.5 MPa STEP 5: cooling from 170° C. to 25° C. over 30 minutes, 0.5 MPa STEP 6: cooling at a constant rate to room temperature over 60 minutes, 0.5 MPa <Evaluation>

The semiconductor devices obtained in the examples and the comparative examples were evaluated as follows. Table 2 shows the results.

(1) Presence of Voids

An ultrasonic inspection imaging device (C-SAM D9500 available from Nippon BARNES Company Ltd.) was used to observe voids in the semiconductor device before and after step 3 of removing voids and to evaluate the presence of voids. If the area where voids were present was less than 1% of the area of the semiconductor chip, it was regarded as "excellent (○)"; if the area was 1% or more and less than 5%, it was regarded as "good (Δ)"; and if the area was 5% or more, it was regarded as "poor (×)".

(2) Electrode Bonding State

The cross section of the semiconductor device was polished using a polisher, and the electrode bonding state of the bonded portion between the electrodes was observed using a microscope. If no adhesive was trapped between the upper and lower electrodes and the electrode bonding state was good, it was regarded as "excellent (○)"; if the adhesive was slightly trapped between the upper and lower electrodes but the upper and the lower electrodes were bonded to each other, it was regarded as "good (Δ)"; and if the adhesive was trapped between the upper and lower electrodes and the upper and lower electrode were not bonded at all to each other, it was regarded as "poor (×)".

(3) Reliability Evaluation (TCT Test)

A heating/cooling cycle test in a temperature range from −55° C. to 125° C. (30 minutes/cycle) was performed on the semiconductor device, and the value of conduction resistance was measured after every 100 cycles. When the value of conduction resistance changed by 5% or more from the initial value of conduction resistance prior to the heating/cooling cycle test, the semiconductor device was regarded as failing the test, and the number of cycles in which the rate of change in conduction resistance remained less than 5% from the initial value was counted for evaluation. If the number of cycles was 1000 or more, it was regarded as "excellent (○)"; if the number of cycles was 300 or more and less than 1000, it was regarded as "good (Δ)"; and if the number of cycles was less than 300, it was regarded as "poor (×)".

TABLE 1

|  | Trade name | Manufacturer | Structure | Epoxy equivalent weight |
|---|---|---|---|---|
| Thermosetting resin | HP-7200HH | DIC | Dicyclopentadiene-type epoxy resin | 280 |
|  | EXA-4850-150 | DIC | Bifunctional epoxy resin | 450 |
|  | EXA-830CRP | DIC | Bisphenol F-type epoxy resin | 160 |
| Thermosetting agent | YH-309 | Mitsubishi Chemical Corporation | Acid anhydride | — |

TABLE 1-continued

|  | Trade name | Manufacturer | Structure | Epoxy equivalent weight |
|---|---|---|---|---|
|  | YH-307 | Mitsubishi Chemical Corporation | Acid anhydride | — |
| Curing accelerator | Fujicure-7000 | T&K TOKA | Liquid imidazole compound | — |
|  | 2MZA-PW | SHIKOKU CHEMICALS CORPORATION | Imidazole compound | — |
|  | 2MA-OK | SHIKOKU CHEMICALS CORPORATION | Imidazole compound | — |
|  | FXR-1121 | SHIKOKU CHEMICALS CORPORATION | Imidazole compound | — |
| High molecular weight compound | SG-P3 | Nagase ChemteX Corporation | Epoxy group-containing acrylic polymer | 4760 |
| Inorganic filler | SSP-01P | Tokuyama Corporation | Phenylsilane-modified spherical silica | — |
| Others | W-5500 | MITSUBISHI RAYON CO., LTD. | Acrylic rubber particles | — |
|  | KBM-573 | Shin-Etsu Chemical Co., Ltd. | Silane coupling agent | — |

TABLE 2

|  |  |  | Example 1 | Example 2 | Example 3 | Example 4 | Example 5 |
|---|---|---|---|---|---|---|---|
| Adhesive (parts by weight) | Thermosetting resin | HP-7200HH | 100 | 100 | 100 | 100 | 100 |
|  |  | EXA-4850-150 | 20 | 20 | 20 | 20 | — |
|  |  | EXA-830CRP | — | — | — | — | 20 |
|  | Thermosetting agent | YH-309 | 60 | 60 | 60 | 60 | — |
|  |  | YH-307 | — | — | — | — | 60 |
|  | Curing accelerator | Fujicure-7000 | 0.8 | 2 | 8 | — | — |
|  |  | 2MZA-PW | — | — | — | — | — |
|  |  | 2MA-OK | — | — | — | — | — |
|  |  | FXR-1121 | — | — | — | 8 | 8 |
|  | High molecular weight compound | SG-P3 | 30 | 30 | 30 | 30 | 30 |
|  | Inorganic filler | SSP-01P | 60 | 60 | 60 | 60 | 350 |
|  | Others | W-5500 | 20 | 20 | 20 | 20 | 20 |
|  |  | KBM-573 | 2 | 2 | 2 | 2 | 2 |
| Amount of inorganic filler |  |  | 20 wt % | 20 wt % | 20 wt % | 20 wt % | 60 wt % |
| Activation energy ΔE (kJ/mol) |  |  | 70 | 72 | 77 | 86 | 91 |
| Reaction rate at 2 seconds at 260° C. |  |  | 8.3% | 12.8% | 19.1% | 7.8% | 16.8% |
| Reaction rate at 4 seconds at 260° C. |  |  | 15.2% | 22.6% | 38.9% | 14.8% | 39.8% |
| Evaluation | Presence of voids | Before step 3 of removing voids | X | X | X | X | X |
|  |  | After step 3 of removing voids | ○ | ○ | ○ | ○ | Δ |
|  | Electrode bonding state |  | ○ | ○ | ○ | ○ | Δ |
|  | Reliability evaluation |  | ○ | ○ | ○ | ○ | Δ |

|  |  |  | Comparative Example 1 | Comparative Example 2 | Comparative Example 3 | Comparative Example 4 | Comparative Example 5 |
|---|---|---|---|---|---|---|---|
| Adhesive (parts by weight) | Thermosetting resin | HP-7200HH | 100 | 100 | 100 | 100 | 100 |
|  |  | EXA-4850-150 | 20 | 20 | 20 | — | — |
|  |  | EXA-830CRP | — | — | — | 20 | 20 |
|  | Thermosetting agent | YH-309 | 60 | 60 | 60 | — | — |
|  |  | YH-307 | — | — | — | 60 | 60 |
|  | Curing accelerator | Fujicure-7000 | 16 | — | — | — | — |
|  |  | 2MZA-PW | — | 8 | — | — | — |
|  |  | 2MA-OK | — | — | 8 | 4 | — |
|  |  | FXR-1121 | — | — | — | — | 8 |

TABLE 2-continued

| | | | | | | |
|---|---|---|---|---|---|---|
| High molecular weight compound | SG-P3 | 30 | 30 | 30 | 30 | 30 |
| Inorganic filler | SSP-01P | 60 | 60 | 60 | 400 | 400 |
| Others | W-5500 | 20 | 20 | 20 | 20 | 20 |
| | KBM-573 | 2 | 2 | 2 | 2 | 2 |
| Amount of inorganic filler | | 20 wt % | 20 wt % | 20 wt % | 63 wt % | 63 wt % |
| Activation energy ΔE (kJ/mol) | | 67 | 70 | 104 | 120 | 92 |
| Reaction rate at 2 seconds at 260° C. | | 25.8% | 42.5% | 26.0% | 11.5% | 18.5% |
| Reaction rate at 4 seconds at 260° C. | | 48.5% | 75.4% | 75.0% | 38.6% | 41.9% |
| Evaluation Presence of voids | Before step 3 of removing voids | X | X | X | X | X |
| | After step 3 of removing voids | X | X | X | X | Δ |
| Electrode bonding state | | ○ | ○ | X | Δ | X |
| Reliability evaluation | | X | X | X | X | X |

INDUSTRIAL APPLICABILITY

The present invention can provide a method for producing a semiconductor device, the method being capable of achieving high reliability by suppressing voids. The present invention can also provide a flip-chip mounting adhesive for use in the method for producing a semiconductor device.

The invention claimed is:

1. A flip-chip mounting adhesive for use in a method for producing a semiconductor device, comprising at least a thermosetting resin and a thermosetting agent,
wherein the thermosetting resin is an epoxy resin,
wherein the adhesive has an activation energy ΔE of 100 kJ/mol or less, a reaction rate of 20% or less at 2 seconds at 260° C., and a reaction rate of 40% or less at 4 seconds at 260° C., as determined by differential scanning calorimetry and Ozawa method, and
wherein the method for producing a semiconductor device comprises:
step 1 of positioning a semiconductor chip on a substrate via the adhesive, the semiconductor chip including bump electrodes each having an end made of solder;
step 2 of heating the semiconductor chip at a temperature of the melting point of the solder or higher to solder and bond the bump electrodes of the semiconductor chip to an electrode portion of the substrate, and concurrently to temporarily attach the adhesive; and
step 3 of removing voids by heating the adhesive under a pressurized atmosphere.

2. The flip-chip mounting adhesive for use in the method for producing a semiconductor device according to claim 1, wherein the adhesive further contains a curing accelerator.

3. The flip-chip mounting adhesive for use in the method for producing a semiconductor device according to claim 2, wherein the curing accelerator is selected from the group consisting of imidazole curing accelerators and tertiary amine curing accelerators.

4. The flip-chip mounting adhesive for use in the method for producing a semiconductor device according to claim 2, wherein the curing accelerator is present in an amount of between 0.5 and 50 parts by weight relative to 100 parts by weight of the thermosetting agent.

5. The flip-chip mounting adhesive for use in the method for producing a semiconductor device according to claim 1, wherein the adhesive further contains an inorganic filler, and the amount of the inorganic filler is 60% by weight or less.

6. The flip-chip mounting adhesive for use in the method for producing a semiconductor device according to claim 1, wherein the adhesive is a film-like adhesive.

7. The flip-chip mounting adhesive for use in the method for producing a semiconductor device according to claim 6, further comprising a compound having an epoxy group, wherein the compound having an epoxy group has a weight average molecular weight of between 10000 and 1000000.

8. The flip-chip mounting adhesive for use in the method for producing a semiconductor device according to claim 7, wherein the compound having an epoxy group is present in an amount of between 3 and 30% by weight.

9. The flip-chip mounting adhesive for use in the method for producing a semiconductor device according to claim 1, wherein the epoxy resin has an epoxy equivalent weight of 160 or more.

10. The flip-chip mounting adhesive for use in the method for producing a semiconductor device according to claim 1, wherein the epoxy resin is selected from the group consisting of bisphenol-type epoxy resins, novolak-type epoxy resins, resorcinol-type epoxy resins, aromatic epoxy resins, naphthalene-type epoxy resins, fluorene-type epoxy resins, cyclopentadiene-type epoxy resins, dicyclopentadiene-type epoxy resins, polyether-modified epoxy resins, NBR-modified epoxy resins, CTBN-modified epoxy resins, and hydrogenated products thereof.

11. The flip-chip mounting adhesive for use in the method for producing a semiconductor device according to claim 1, wherein the thermosetting agent is selected from the group consisting of acid anhydride curing agents, phenolic curing agents, amine curing agents, latent curing agents, cationic catalyst-type curing agents, and mixtures thereof.

12. The flip-chip mounting adhesive for use in the method for producing a semiconductor device according to claim 1, wherein the thermosetting agent is present in an amount of between 60 and 110 equivalents relative to the total amount of epoxy groups in the adhesive.

* * * * *